(12) United States Patent
Wu et al.

(10) Patent No.: US 8,111,542 B2
(45) Date of Patent: Feb. 7, 2012

(54) 8T LOW LEAKAGE SRAM CELL

(75) Inventors: Jui-Jen Wu, Hsinchu (TW); Yen-Huei Chen, Hsinchu (TW); Shao-Yu Chou, Chu Pei (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 531 days.

(21) Appl. No.: 12/273,959

(22) Filed: Nov. 19, 2008

(65) Prior Publication Data

US 2010/0124099 A1    May 20, 2010

(51) Int. Cl.
*G11C 11/00* (2006.01)
(52) U.S. Cl. ........ 365/154; 365/63; 365/72; 365/230.05
(58) Field of Classification Search .................. 365/154, 365/230.05, 63, 72
See application file for complete search history.

(56) References Cited

U.S. PATENT DOCUMENTS

| | | | |
|---|---|---|---|
| 7,813,161 B2 * | 10/2010 | Luthra | 365/154 |
| 2007/0242513 A1 | 10/2007 | Chang et al. | 365/185.07 |
| 2007/0279966 A1 | 12/2007 | Houston | 365/154 |
| 2008/0144360 A1 * | 6/2008 | Takahashi | 365/149 |
| 2009/0303821 A1 * | 12/2009 | Arsovski et al. | 365/203 |

OTHER PUBLICATIONS

Ramadurai, Vinod et al., "A Disturb Decoupled Column Select 8T SRAM Cell", IEEE 2007 Custom Intergrated Circuits Conference (CICC) 2007 IEEE, pp. 25-28.

* cited by examiner

*Primary Examiner* — Tuan Nguyen
*Assistant Examiner* — Toan Le
(74) *Attorney, Agent, or Firm* — K&L Gates LLP

(57) ABSTRACT

This invention discloses a static random access memory (SRAM) cell comprising a pair of cross-coupled inverters having a storage node, and a NMOS transistor having a gate terminal, a first and a second source/drain terminal connected to the storage node, a read word-line (RWL) and a read bit-line (RBL), respectively, the RWL and RBL being activated during a read operation and not being activated during any write operation.

17 Claims, 4 Drawing Sheets

8T LOW LEAKAGE SRAM CELL

BACKGROUND

The present invention relates generally to static random access memory (SRAM) cell, and, more particularly, to SRAM cells that can operate under ultra-low voltage.

Semiconductor memory devices include, for example, static random access memory, or SRAM, and dynamic random access memory, or DRAM. DRAM memory cell has only one transistor and one capacitor, so it provides a high degree of integration. But DRAM requires constant refreshing, its power consumption and slow speed limit its use mainly for computer main memories. SRAM cell, on the other hand, is bi-stable, meaning it can maintain its state indefinitely as long as an adequate power is supplied. SRAM can operate at a higher speed and lower power dissipation, so computer cache memories use exclusively SRAMs. Other applications include embedded memories and networking equipment memories.

One well-known conventional structure of a SRAM cell is a six transistor (6T) cell that comprises six metal-oxide-semiconductor (MOS) transistors. Briefly, a 6T SRAM cell 100, as shown in FIG. 1, comprises two identical cross-coupled inverters 102 and 104 that form a latch circuit, i.e., one inverter's output connected to the other inverter's input. The latch circuit is connected between a power and a ground. Each inverter 102 or 104 comprises a NMOS pull-down transistor 115 or 125 and a PMOS pull-up transistor 110 or 120. The inverter's outputs serve as two storage nodes C and D, when one is pulled to low voltage, the other is pulled to high voltage. A complementary bit-line pair 150 and 155 is coupled to the pair of storage nodes C and D via a pair of pass-gate transistors 130 and 135, respectively. The gates of the pass-gate transistors 130 and 135 are commonly connected to a word-line 140. When the word-line voltage is switched to a system high voltage, or Vcc, the pass-gate transistors 130 and 135 are turned on to allow the storage nodes C and D to be accessible by the bit-line pair 150 and 155, respectively. When the word-line voltage is switched to a system low voltage, or Vss, the pass-gate transistors 130 and 135 are turned off and the storage nodes C and D are essentially isolated from the bit lines, although some leakage can occur. Nevertheless, as long as Vcc is maintained above a threshold, the state of the storage nodes C and D is maintained indefinitely.

However, the traditional 6T SRAM cell 100 faces many challenges as processes migrate to deep submicron technologies. One of the challenges is adapting very low operating voltages to transistor's small sizes. The low operating voltage causes read operation instability as the transistors' threshold voltages are too large as compared with the operating voltage, hence leaving little switching margins. Another challenge is that during a read operation, the storage nodes C and D are directly coupled to the bit-lines 150 and 155, respectively, and thus are susceptible to charge sharing effects which also cause read operation instability especially when there is a large number of cells in the bit-lines 150 and 155.

As such, what is desired is a SRAM cell that has stable operations even in low operating voltages and large cell arrays.

SUMMARY

This invention discloses a static random access memory (SRAM) cell comprising a pair of cross-coupled inverters having a storage node, and a NMOS transistor having a gate terminal, a first and a second source/drain terminal connected to the storage node, a read word-line (RWL) and a read bit-line (RBL), respectively, the RWL and RBL being activated during a read operation and not being activated during any write operation.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses an eight-transistor (8-T) SRAM cell that separate read and write path to minimize read/write disturb, so that the 8-T SRAM cell can operate at very low voltage.

Figure 1:
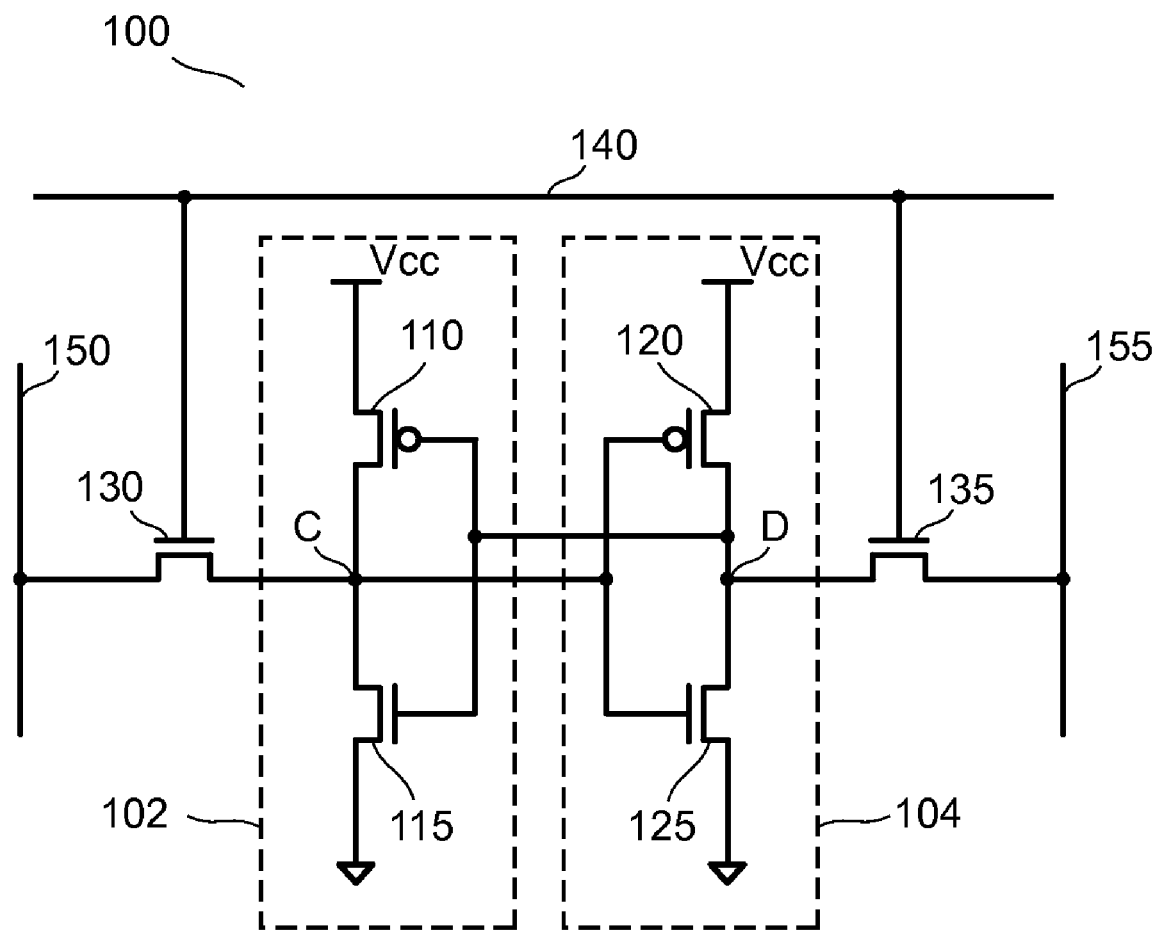
FIG. 1 is a schematic diagram illustrating a conventional 6-T SRAM cell.
Figure 2:
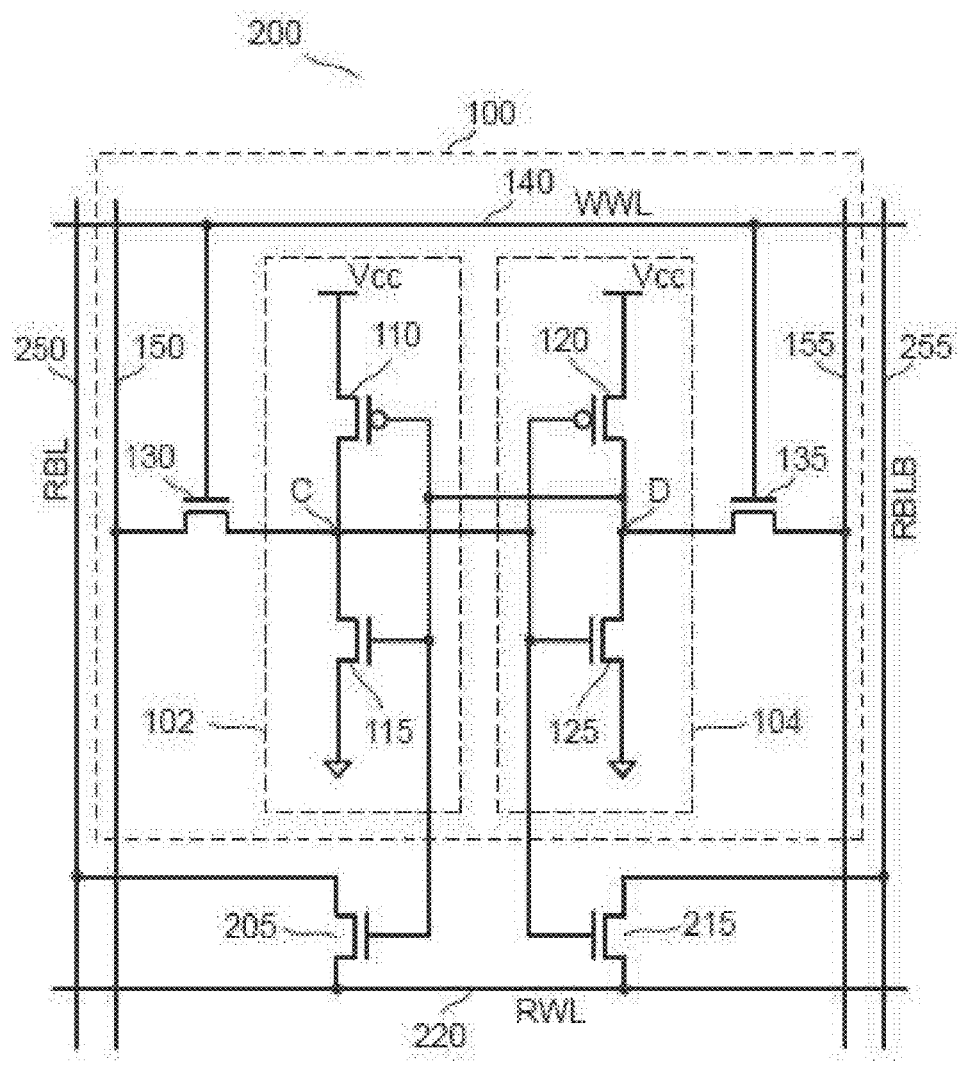
FIG. 2 is a schematic diagram illustrating an 8-T SRAM cell according to one embodiment of the present invention.

FIG. 2 is a schematic diagram illustrating an 8-T SRAM cell 200 according to one embodiment of the present invention. The 8-T SRAM cell 200 is formed by adding two NMOS transistors 205 and 215 to the conventional 6T-SRAM cell 100 of FIG. 1. A gate, source and drain of the NMOS transistor 205 are connected to the SRAM storage node D, a read bit-line (RBL) 250 and a read word-line (RWL) 220, respectively. A gate, source and drain of the NMOS transistor 215 are connected to the SRAM storage node C, the complementary read bit-line (RBLB) 255 and the RWL 220, respectively. The RWL 220 is a dedicated read word-line. The RBL 250 and RBLB 255 are dedicated read bit-lines. The RWL 220, the RBL 250 and the RBLB 255 are activated during a read operation and not activated during a write operation. The word-line 140 becomes a dedicated write word-line (WWL). The bit-line pair 150 and 155 becomes a dedicated write bit-line (WBL) pair. The WWL and the WBL are activated during a write operation and not activated during any read operation. Apparently, the functional, i.e., data storage, element of the SRAM cell 200 are still performed by the cell 100 included in the cell 200.

In a write operation, the WWL 140 is activated or turned to a high voltage (VDD), which turns on the pass gate transistors 130 and 135. Driving voltages at the WBL pairs 150 and 155 will be passed to the storage node C and D, respective, and overcome the original states stored thereon. The original states are maintained by the cross-coupled inverters 102 and 104. The write operation is no different from that in a conventional 6-T SRAM cell.

Before a read operation, the RWL 220 is pulled to the VDD, the RBL 250 and RBLB 255 is equalized to a predetermined voltage, typically the VDD. During the read operation, the RWL 220 is turned to the VSS and the voltage equalization for the RBL 250 and RBLB 255 is released. If the storage node C stores a low voltage, the NMOS transistor 215 remains off and the RBLB 255 remains substantially at the VDD during the read operation. In this case the storage node D stores a high voltage, the NMOS transistor 205 is turned on, and the RBL 250 will be pulled down toward the VSS. Then a voltage difference between the RBL 250 and RBLB 255 will be developed and sensed by a sense amplifier (not shown). On the other hand, if the storage nodes C and D store high and low voltage, respectively, the RBL 250 will remain substantially at the VDD, and the RBLB 255 will be pulled down toward the VSS. An opposite data will be read out then.

Referring to FIG. 2, an advantage of the 8-T SRAM cell 200 over the traditional 6-T SRAM cell 100 of FIG. 1, is that the gates of the NMOS transistors 205 and 215 are connected to the storage nodes D and C, respective, the loading of the storage nodes D and C is much reduced. In fact, the RBL 250 or RBLB 255 is not driven directly by the storage nodes D and C, respectively. Instead the driving capability of the storage node D or C is amplified by the NMOS transistor 205 or 215. Therefore the read sensing speed of the 8-T SRAM cell 200 will be faster. The same RBL 250 and RBLB 255 can have a greater number of SRAM cells 200. In driving the RBL 250 or RBLB 255, the storage nodes D or C does not have a voltage drop across the source-and-drain of a pass gate NMOS transistor. As a result, the 8-T SRAM cell 200 can operate at a lower supply voltage than the conventional 6-T SRAM cell 100 of FIG. 1.

Figure 3:
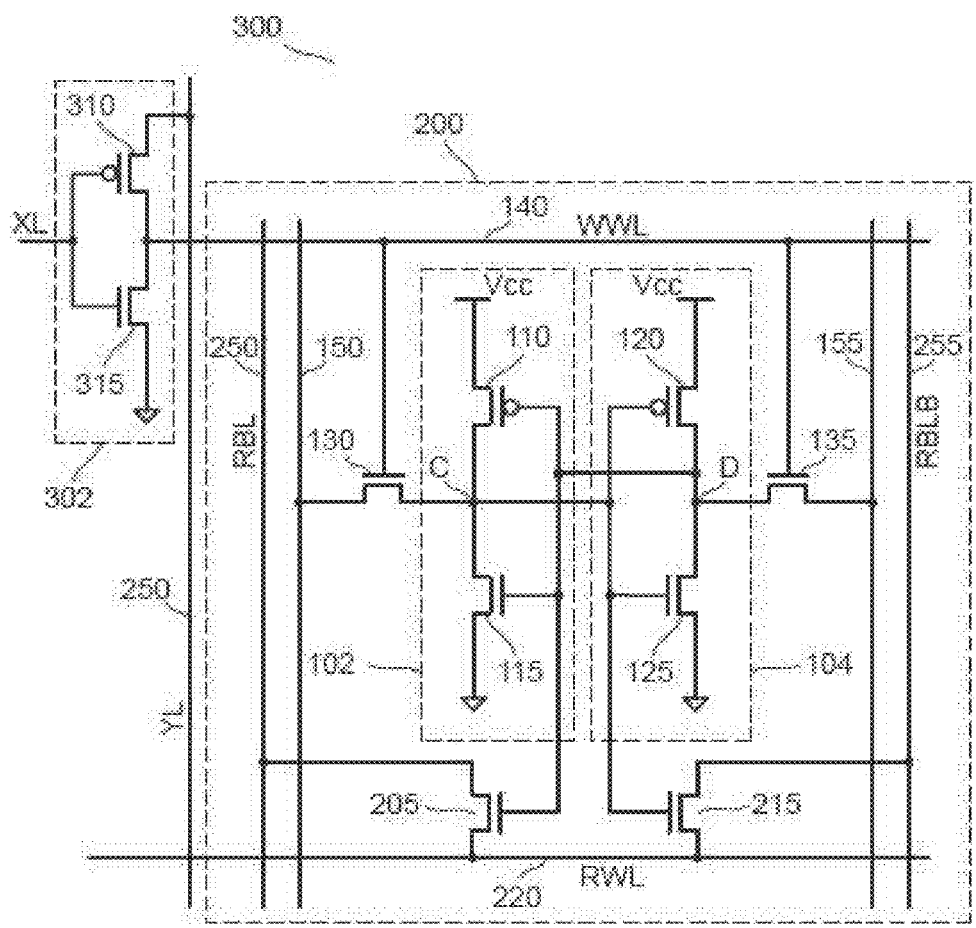
FIG. 3 is a schematic diagram illustrating a write select circuit being used with the 8-T SRAM cell of FIG. 2.

FIG. 3 is a schematic diagram illustrating a write select circuit 302 being used with the 8-T SRAM cell 200 of FIG. 2. The write select circuit 302 comprises a PMOS transistor 310 and a NMOS transistor 315 forming an inverter. A source of the PMOS transistor 310 is connected to a y select line (YL). Typically the YL is connected to all the 8-T SRAM cells 200 in a column. An input of the write select circuit 302 is connected to an x select line (XL). An output of the write select circuit 302 is connected to the WWL 140. Typically a row of predetermined number of the 8-T SRAM cells 200 has only one write select circuit 302. The XL functions as a global word-line and the WWL 140 is a local word-line. Only when both the XL and YL are activated, the WWL 140 can be activated. Adding the write select circuit 302 is to reduce write disturb to the SRAM cells 200. Apparently, XL and YL run in the row and column direction, respectively, is entirely arbitrary, i.e., the XL can run in the column direction and the YL can run in the row direction.

Figure 4:
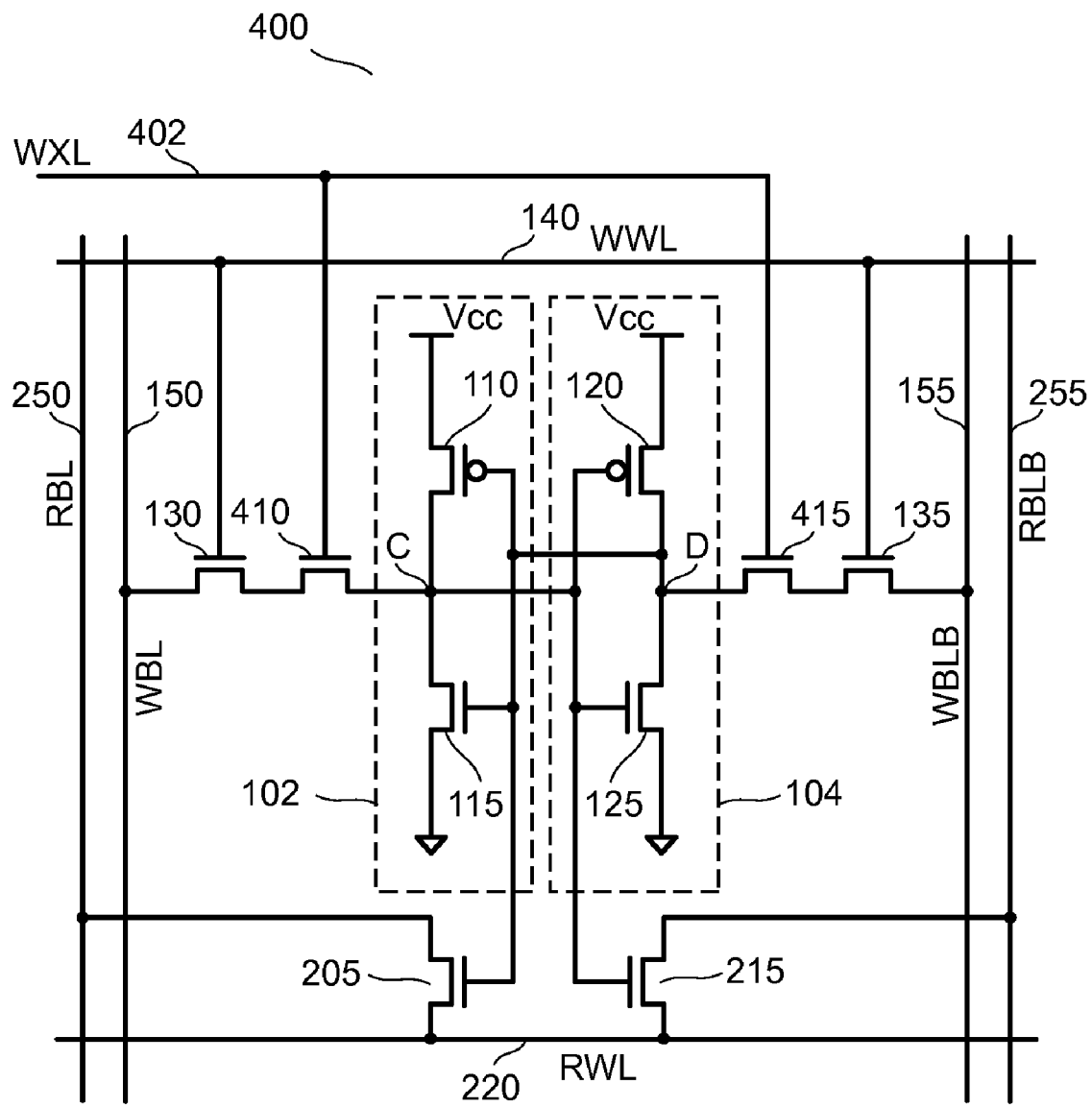
FIG. 4 is a schematic diagram illustrating an alternative write select scheme used with the 8-T SRAM cell of FIG. 2.

FIG. 4 is a schematic diagram illustrating an alternative write select scheme used with the 8-T SRAM cell 200 of FIG. 2. The alternative write select scheme is to add two additional pass-gate transistors 410 and 415 to the 8-T SRAM cell 200. Therefore, the new SRAM cell 400 has 10 transistors (10-T). The NMOS transistor 410 is inserted between the storage node C and the write bit-line (WBL) 150 in serial connection with the pass-gate NMOS transistor 130. The NMOS transistor 415 is inserted between the storage node D and the complimentary write bit-line (WBLB) 155 in serial connection with the pass-gate NMOS transistor 135. Gates of the NMOS transistor 410 and 415 are connected to a write select line (WXL) 402. A block of the SRAM cells 400 may be connected to the same WXL 402, while other blocks of the SRAM cells 400 have their own write select lines. This scheme allows only one block of SRAM cells 400 being activated during a write operation, so that disturb can be reduced.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) cell comprising:
   a pair of cross-coupled inverters having a first storage node;
   a first NMOS transistor having a gate terminal, a first and a second source/drain terminal connected to the first storage node, a read word-line (RWL) and a first read bit-line (RBL), respectively, the RWL and RBL being activated during a read operation and not being activated during any write operation;
   a second storage node belonging to the pair of cross-coupled inverters, the second storage node being complementary to the first storage node; and
   a second NMOS transistor having a gate terminal, a third and a fourth source/drain terminal connected to the second storage node, the RWL and a second RBL, respectively;
   a third NMOS transistor having a gate terminal, a fifth and sixth source/drain terminal connected to a write word-line (WWL), the first storage node and a first write bit-line (WBL), respectively; and
   an inverter having a voltage supply, an input and an output connected to a first select line, a second select line and the WWL, respectively.

2. The SRAM cell of claim 1, wherein the activation of the RWL involves a voltage change from a data maintenance state to a data access state.

3. The SRAM cell of claim 1, wherein the first and second RBL being activated synchronously.

4. The SRAM cell of claim 1, wherein the WWL and WBL being activated during a write operation and not being activated during any read operation.

5. The SRAM cell of claim 4, wherein the activation of the WWL involves a voltage change from a data maintenance state to a data access state.

6. The SRAM cell of claim 4 further comprising a fourth NMOS transistor coupled between the first storage node and the WBL in serial connection with the third NMOS transistor.

7. The SRAM cell of claim 1 further comprising:
   a fourth NMOS transistor having a gate terminal, a ninth and tenth source/drain terminal connected to the WWL, the second storage node, and a second WBL, respectively, wherein the WWL and the first and second WBL are activated during a write operation and not being activated during any read operation, and the first WBL is complementary to the second WBL.

8. A static random access memory (SRAM) cell comprising:

a pair of cross-coupled inverters having a first and a second storage node, the first and second storage node being complementary to each other;

a first NMOS transistor having a gate terminal, a first and a second source/drain terminal connected to the first storage node, a read word-line (RWL) and a first read bit-line (RBL), respectively;

a second NMOS transistor having a gate terminal, a third and a fourth source/drain terminal connected to the second storage node, the RWL and a second RBL, respectively;

a third NMOS transistor having a gate terminal, a fifth and a sixth source/drain terminal connected to a write word-line (WWL), the first storage node and a first write bit-line (WBL), respectively;

a fourth NMOS transistor having a gate terminal, a seventh and a eighth source/drain terminal connected to the WWL, the second storage node and a second WBL, respectively; and an inverter having a voltage supply, an input and an output connected to a first select line, a second select line and the WWL, respectively, wherein the RWL, the first and second RBL are activated during a read operation and not activated during any write operation, and the first and second RBL are activated synchronously.

9. The SRAM cell of claim 8, wherein the activation of the RWL involves a voltage change from a data maintenance state to a data access state.

10. The SRAM cell of claim 8, wherein the WWL, the first and second WBL are activated during a write operation and not activated during any read operation, and the first and second WBL are activated synchronously.

11. The SRAM cell of claim 10, wherein the activation of the WWL involves a voltage change from a data maintenance state to a data access state.

12. The SRAM cell of claim 10 further comprising:
a fifth NMOS transistor coupled between the first storage node and the first WBL in serial connection with the third NMOS transistor; and
a sixth NMOS transistor coupled between the second storage node and the second WBL in serial connection with the fourth NMOS transistor.

13. A static random access memory (SRAM) cell comprising:

a pair of cross-coupled inverters having a first storage node;

a first NMOS transistor having a gate terminal, a first and a second source/drain terminal connected to the first storage node, a read word-line (RWL) and a first read bit-line (RBL), respectively, the RWL and RBL being activated during a read operation and not being activated during any write operation;

a second NMOS transistor having a gate terminal, a third and fourth source/drain terminal connected to a write word-line (WWL), the first storage node and a first write bit-line (WBL), respectively, the WWL and the first WBL being activated during a write operation and not being activated during any read operation; and an inverter having a voltage supply, an input and an output connected to a first select line, a second select line and the WWL, respectively.

14. The SRAM cell of claim 13, wherein the activations of the RWL and WWL involves a voltage change from a data maintenance state to a data access state.

15. The SRAM cell of claim 13 further comprising a third NMOS transistor coupled between the first storage node and the first WBL in serial connection with the second NMOS transistor.

16. The SRAM cell of claim 15 further comprising:
a second storage node belonging to the pair of cross-coupled inverters, the second storage node being complementary to the first storage node;
a fourth NMOS transistor having a gate terminal, a fifth and a sixth source/drain terminal connected to the second storage node, the RWL and a second RBL, respectively, the first and second RBL being activated synchronously; and
a fifth NMOS transistor having a gate terminal, a seventh and eighth source/drain terminal connected to the WWL, the second storage node and a second write bit-line (WBL), respectively, the first and second WBL being activated synchronously.

17. The SRAM cell of claim 16 further comprising:
a sixth NMOS transistor coupled between the first storage node and the first WBL in serial connection with the second NMOS transistor; and
a seventh NMOS transistor coupled between the second storage node and the second WBL in serial connection with the fifth NMOS transistor.

* * * * *